(12) United States Patent
Bassen et al.

(10) Patent No.: US 10,895,591 B2
(45) Date of Patent: *Jan. 19, 2021

(54) ELECTROMAGNETIC RADIATION DETECTION APPARATUS AND METHOD OF DETECTING LOW LEVELS OF MILLIMETER WAVE ELECTROMAGNETIC RADIATION

(71) Applicant: The Government of the United States of America, as represented by the Secretary of Homeland Security, Washington, DC (US)

(72) Inventors: Howard Bassen, Chevy Chase, MD (US); Gonzalo Mendoza, Sterling, VA (US); Amir Razjouyan, Annandale, VA (US); Mohammed Eslami, Gaithersburg, MD (US); Negin Shahshahan, Philadelphia, PA (US)

(73) Assignee: The Government of the United States of America, as represented by the Secretary of Homeland Security, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/295,622

(22) Filed: Mar. 7, 2019

(65) Prior Publication Data
US 2019/0204371 A1 Jul. 4, 2019

Related U.S. Application Data

(63) Continuation of application No. 16/031,353, filed on Jul. 10, 2018, now Pat. No. 10,267,837.
(Continued)

(51) Int. Cl.
*G01R 29/08* (2006.01)
*G09G 3/36* (2006.01)
(Continued)

(52) U.S. Cl.
CPC ..... *G01R 29/0878* (2013.01); *G01R 29/0814* (2013.01); *G01R 29/0871* (2013.01);
(Continued)

(58) Field of Classification Search
CPC .......... G01R 29/0878; G01R 33/285; G01R 33/287; G01R 33/3808; G01R 33/383; G09G 3/36
(Continued)

(56) References Cited

U.S. PATENT DOCUMENTS 5,886,534 A * 3/1999 Bakhtiari ............... G01N 22/02
324/642
6,329,649 B1 * 12/2001 Jack ......................... G01J 5/20
250/250

(Continued)

OTHER PUBLICATIONS

Seth J. Seidman, Wolfgang Kainz, Jon Casamento, and Donald Witters, Electromagnetic Compatibility Testing of Implantable Neurostimulators Exposed to Metal Detectors, the Open Biomedical Engineering Journal, vol. 4, pp. 63-70, 2010.
(Continued)

*Primary Examiner* — Taeho Jo
(74) *Attorney, Agent, or Firm* — Lavanya Ratnam; Kelly G. Hyndman (57) ABSTRACT

An apparatus for detecting low level pulses of millimeter wave electromagnetic radiation has an electromagnetic field receiver including: a receiving antenna configured to receive an input signal at one or more frequencies ranging from 10 GHz to 100 GHz, and a diode detector coupled to the receiving antenna, the diode detector providing an output voltage signal in response to the input signal. The apparatus also has an electronic signal processor. This produces an amplified voltage signal. The electronic signal processor also produces from the amplified voltage signal a reduced bandwidth, unipolar voltage signal proportional to a peak power of the input signal. The electronic signal processor (Continued)

uses this to produce an amplified reduced bandwidth, unipolar voltage signal. At least the electronic signal processor is encased in an electronically shielded housing.

20 Claims, 4 Drawing Sheets

Related U.S. Application Data (60) Provisional application No. 62/530,456, filed on Jul. 10, 2017.

(51) Int. Cl.
*G01R 33/383* (2006.01)
*G01R 33/28* (2006.01)
*G01R 33/38* (2006.01)

(52) U.S. Cl.
CPC .............. *G09G 3/36* (2013.01); *G01R 33/285* (2013.01); *G01R 33/287* (2013.01); *G01R 33/383* (2013.01); *G01R 33/3808* (2013.01)

(58) Field of Classification Search
USPC ......................................................... 250/395
See application file for complete search history.

(56) References Cited

U.S. PATENT DOCUMENTS

| | | | | |
|---|---|---|---|---|
| 2002/0126731 | A1* | 9/2002 | Stergiopoulos | G01K 11/006 374/122 |
| 2002/0175849 | A1* | 11/2002 | Arndt | G01S 13/0209 342/22 |
| 2003/0163042 | A1* | 8/2003 | Salmon | G01S 13/89 600/436 |
| 2004/0174289 | A1* | 9/2004 | Singh | G01S 13/04 342/22 |
| 2009/0195435 | A1* | 8/2009 | Kapilevich | G01S 7/412 342/22 |
| 2009/0212988 | A1* | 8/2009 | Jung | G01S 13/887 342/22 |
| 2010/0005044 | A1* | 1/2010 | Bowring | G01S 7/025 706/20 |
| 2010/0084630 | A1* | 4/2010 | Kukushkin | H01L 31/03523 257/15 |
| 2010/0290063 | A1* | 11/2010 | Bakhtiari | G01H 9/00 356/614 |
| 2011/0304515 | A1* | 12/2011 | Wellman | H01Q 15/08 343/720 |
| 2012/0242544 | A1* | 9/2012 | Gopalsami | G01T 7/00 342/460 |
| 2012/0293163 | A1* | 11/2012 | Sasson | H04B 17/102 324/149 |
| 2013/0050015 | A1* | 2/2013 | Black | H01Q 1/248 342/175 |
| 2014/0205067 | A1* | 7/2014 | Carol | A61N 5/1031 378/65 |
| 2014/0253362 | A1* | 9/2014 | Einat | G01V 8/005 342/27 |
| 2014/0300502 | A9* | 10/2014 | Daly | G01V 8/005 342/22 |
| 2014/0300503 | A9* | 10/2014 | Daly | G01V 3/15 342/22 |
| 2016/0093957 | A1* | 3/2016 | Moeller | H01Q 1/248 343/810 |
| 2016/0116422 | A1* | 4/2016 | Portune | G07D 7/10 324/638 |
| 2016/0131756 | A1* | 5/2016 | Einat | G01V 8/005 342/27 |
| 2017/0219379 | A1* | 8/2017 | Rapadas | G01R 31/2822 |
| 2019/0054318 | A1* | 2/2019 | Goer | A61N 5/1067 |

OTHER PUBLICATIONS

Medical electrical equipment—Part 1-2: General requirements for basic safety and essential performance—Collateral standard: Electromagnetic compatibility—Requirements and tests(IEC 60601-1-2:2007, modified), International Electrotechnical Commission (2007), Switzerland.

Implants for surgery—Active implantable medical devices Part 3: Implantable neurostimulators, ANSI/AAMI/ISO 14708-3:2008/(R) 2011, Approved Jun. 18, 2009 by the Association for the Advancement of Medical Instrumentation.

Active implantable medical devices, Electromagnetic compatibility, EMC test protocols for implantable cardiac pacemakers, implantable cardioverter defibrillators and cardiac resynchronization devices International Standard, ISO 14117, First edition, Jul. 15, 2012.

ICNIRP Guidelines, ICNIRP Statement on Health Issues Associated with Millimeter Wave Whole Body Imaging Technology, International Commission on Non-Ionizing Radiation Protection, Health Physics 102(1):81-82; 2012.

Devices that may Interfere with Implantable Cardioverter Defibrillators, (ICDs)http://www.heart.org/HEARTORG/Conditions/Arrhythmia/PreventionTreatmentofArrhythmia/Devices-that-may-Interfere-with-Implantable-Cardioverter-Defibrillators-ICDs_UCM _ 448464_Article.jsp#.V46A-fnR-00, Sep. 30, 2016.

DHS/ST/TSL-12/118, Compilation of Emission Safety Reports on the L3 Communications, Inc. Pro Vision 100 Active Millimeter Wave, Advanced Imaging Technology (AIT) System, version 2, Sep. 1, 2012, U.S. Department of Homeland Security, Science and Technology Directorate, http://www.tsa.gov/sites/default/files/assets/pdf/foia/dhssttsl112 II 8 _ 03142013.pdf.

IEEE Standard for Safety Levels with Respect to Human Exposure to Radio Frequency Electromagnetic Fields, 3 kHz to 300 GHz, Institute of Electrical and Electronics Engineers Apr. 2006.

ICNIRP: Guidelines for Limiting Exposure to Time-Varying Electric, Magnetic, and Electromagnetic Fields (up to 300 GHz). Health Physics 1998; 74 (4):494-522. International Commission on Non-Ionizing Radiation Protection.

J. Accardo and M. Chaudhry, Radiation exposure and privacy concerns surrounding full-body scanners in airports, Journal of Radiation Research and Applied Sciences 7 (2014) pp. 198-200.

Hank Zumbahlen, Staying Well Grounded, Analog dialogue, vol. 46—Jun. 2012, http://www.analog.com/library/analogDialogue/archives/46-06/staying_well_grounded.html.

* cited by examiner

ELECTROMAGNETIC RADIATION DETECTION APPARATUS AND METHOD OF DETECTING LOW LEVELS OF MILLIMETER WAVE ELECTROMAGNETIC RADIATION

CROSS-REFERENCE TO RELATED APPLICATIONS

This application is a continuation of U.S. Non-provisional application Ser. No. 16/031,353 filed on Jul. 10, 2018, which claims the benefit of priority of U.S. Provisional Application No. 62/530,456, filed on Jul. 10, 2017, the disclosures of all of which are herein incorporated by reference in their entirety.

GOVERNMENT RIGHTS

This disclosure was made with government support under an Interagency Agreement between the U.S. Food and Drug Administration and the Transportation Security Administration. The United States Government has certain rights in this disclosure.

BACKGROUND

The "background" description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

High frequency electromagnetic radiation exists in free space from an increasing number of sources including power stations, radios, radars, televisions, computers, mobile phones, microwave ovens and security systems, e.g., millimeter wave body scanners used in airports. The increased possibility of exposure from electromagnetic-emitting devices, such as millimeter wave body scanners, has aroused concerns about the health risks potentially associated with exposure to even low levels of electromagnetic radiation. Accordingly, the ability to conveniently and inexpensively determine whether or not any given device, such as a millimeter wave scanner, is emitting electromagnetic radiation at or below safety levels is desirable.

SUMMARY

The present disclosure is directed to a low cost apparatus, including a hand-held, portable apparatus, which may be used, e.g., to confirm the safety of emissions from millimeter wave scanners used in airports. The present electromagnetic radiation detector apparatus may reveal the presence of even weak electromagnetic emissions at various locations, e.g., inside or around an electromagnetic radiation-emitting device, such as a millimeter wave scanner. For example, in the case of an L3 PROVISION® millimeter wave scanner (L3 Technologies, Inc. New York, N.Y.), the radiating elements sweep around a person being scanned in a few seconds, thus exposing the individual to numerous very low level pulses of millimeter wave energy. The present apparatus may be used to assess such emissions and display a graphical and numerical indication of a sensed level of energy density.

One of many pre-set levels may be set within the present electromagnetic radiation detector apparatus so that the apparatus indicates the presence of electromagnetic radiation at levels much lower than the maximum permissible levels specified in the IEEE Standard C95.1-2005. See e.g., IEEE Standard for Safety Levels with Respect to Human Exposure to Radio Frequency Electromagnetic Fields, 3 kHz to 300 GHz. Institute of Electrical and Electronics Engineers, April 2006, which is herein incorporated by reference in its entirety. Accordingly, the present electromagnetic radiation detector apparatus may be used to verify the presence of electromagnetic emissions and/or to verify that the emissions are well below the appropriate levels of the prevailing safety standards.

In one aspect, the present disclosure is directed to an apparatus for detecting low level pulses of millimeter wave electromagnetic radiation including: i) an electromagnetic field receiver including: a receiving antenna configured to receive an input signal at one or more frequencies ranging from 10 GHz to 100 GHz, and a diode detector coupled to the receiving antenna, the diode detector providing an output voltage signal in response to the input signal; ii) an electronic signal processor including: at least two operational amplifiers cascaded sequentially and configured to receive the output voltage signal from the electromagnetic field receiver and to produce an amplified voltage signal, an envelope detection circuit configured to receive the amplified voltage signal and to produce a reduced bandwidth, unipolar voltage signal proportional to a peak power of the input signal, and at least one low frequency operational amplifier configured to receive the reduced bandwidth, unipolar voltage signal and to produce an amplified reduced bandwidth, unipolar voltage signal, wherein at least the electronic signal processor is encased in an electronically shielded housing, and wherein the input signal is a pulse from a millimeter wave scanner, and the pulse has an electric field strength of at least 0.02 V/m with a duration of at least 5 microseconds.

In another aspect, the present disclosure is directed to a hand-held portable apparatus for detecting low level pulses of millimeter wave electromagnetic radiation including: i) an electromagnetic field receiver including: a receiving antenna configured to receive an input signal at one or more frequencies ranging from 10 GHz to 100 GHz, and a diode detector including a Schottky diode coupled to the receiving antenna, the Schottky diode providing an output voltage signal in response to the input signal; wherein the input signal is a pulse from a millimeter wave scanner, and wherein the pulse has an electric field strength of at least 0.02 V/m with a duration of at least 5 microseconds; ii) an electronic signal processor including: two operational amplifiers cascaded sequentially and configured to receive the output voltage signal from the electromagnetic field receiver and to produce an amplified voltage signal, an envelope detection circuit configured to receive the amplified voltage signal and to produce a reduced bandwidth, unipolar voltage signal proportional to a peak power of the input signal, wherein the envelope detection circuit is a true RMS chip, one low frequency operational amplifier configured to receive the reduced bandwidth, unipolar voltage signal and to produce an amplified reduced bandwidth, unipolar voltage signal; and an active analog filter circuit connected between the at least two operational amplifiers and the envelope detection circuit, wherein at least the electronic signal processor is encased in an electronically shielded housing; and iii) an output display comprising a microprocessor configured to receive the amplified reduced bandwidth, unipolar voltage signal and a graphical digital display, wherein the microprocessor analyzes the amplified reduced bandwidth, unipolar voltage signal and drives the graphical digital display.

The present disclosure is further directed to a method of detecting a low level of short pulses of millimeter wave electromagnetic radiation including: exposing a receiving antenna to pulses of electromagnetic fields from a signal generator, wherein the receiving antenna is configured to receive an input signal at one or more frequencies ranging from 10 GHz to 100 GHz; providing an output voltage signal via a diode detector coupled to the receiving antenna, wherein the output voltage signal is in response to the input signal; amplifying the voltage signal via at least two operational amplifiers cascaded sequentially; producing a reduced bandwidth, unipolar voltage signal proportional to a peak power of the input signal via an envelope detection circuit; amplifying the reduced bandwidth, unipolar voltage signal proportional to the peak power of the input signal via at least one low frequency operational amplifier; and analyzing the amplified reduced bandwidth, unipolar voltage signal with a microprocessor; and displaying a magnitude of the millimeter wave electromagnetic radiation via a graphical digital display.

BRIEF DESCRIPTION OF THE DRAWINGS

An appreciation of the disclosure and many of the attendant advantages thereof may be understood by reference to the accompanying drawings. Included in the drawings are the following figures.

DETAILED DESCRIPTION

Apparatus

Figure 1:
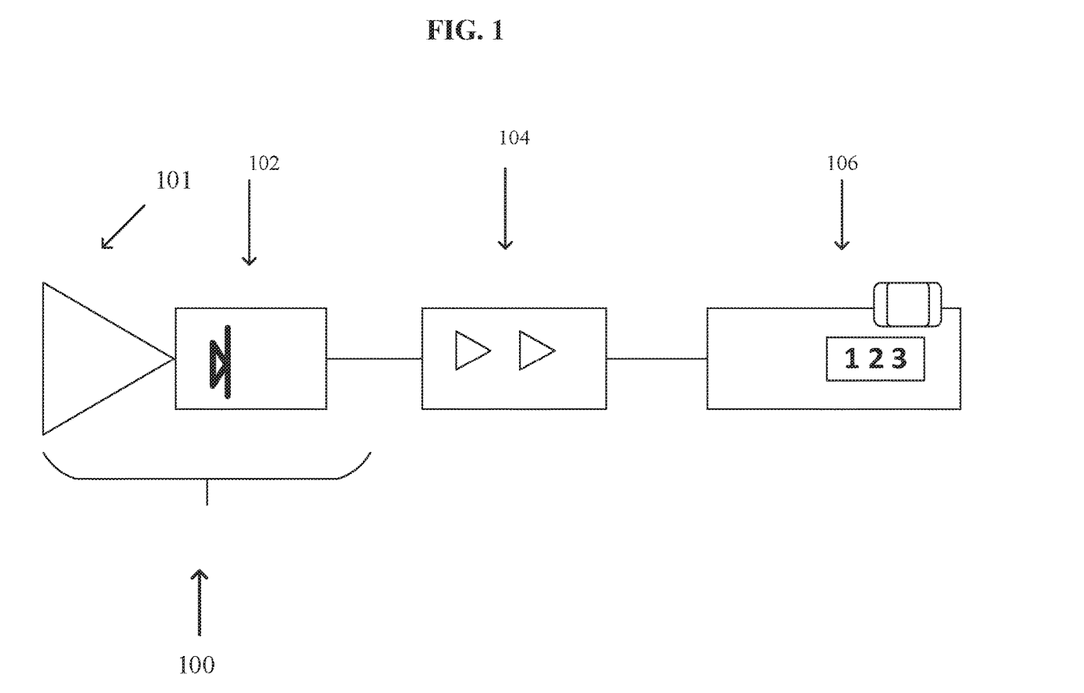
FIG. 1 depicts an implementation of an electromagnetic radiation detector apparatus in accordance with the present disclosure as described in the detailed description.

Referring now to the drawings, FIG. 1 depicts an electromagnetic radiation detector apparatus including an electromagnetic field receiver 100, an electronic signal processor 104 and an output display 106. In some embodiments, the electromagnetic field receiver 100 includes a receiving antenna 101 and a diode detector 102.

In some embodiments, the electromagnetic field receiver 100 may be configured to receive an input signal, e.g. electromagnetic emissions from an electromagnetic radiation source emitting very short pulses (not shown). The electromagnetic radiation source (not shown) may be provided by, e.g., a millimeter wave body scanner, such as an Advanced Imaging Technology (AIT) device that uses millimeter wave emissions, e.g., an L3 PROVISION® millimeter wave body scanner.

In some embodiments, the input signal has a frequency in the range of 10 GHz to 100 GHz, such as 20 GHz to 30 GHz, more typically 30 GHz. For example, in some embodiments, the electromagnetic radiation has a frequency range in the Ku band (12.5-18 GHz, wavelength range 1.7-2.4 centimeters), K band (18 to 26.5 GHz, wavelength range 1.1-1.7 centimeters), Ka band (26.5-40 GHz, wavelength range 0.75-1.1 centimeters), Q band (30 to 50 GHz, wavelength range 6.0-9.1 millimeters (mm)), V band (50 to 75 GHz, wavelength range 4.0 to 6.0 millimeters (mm)) or greater, e.g., the E band (60 to 90 GHz, wavelength range 5.0-3.33 mm), W band (75 to 110 GHz, wavelength range 2.7 mm to 4.0 mm) or F band (90 to 140 GHz, wavelength range 2.1-3.3 mm). Typically, the electromagnetic radiation has a frequency in the K, Ka band or Q band, such as the Q band, e.g., more typically about 30 GHz. In some embodiments, the electromagnetic radiation has a frequency in the E band.

Typically, the sensitivity of the present electromagnetic radiation detector apparatus ranges from about 0.01 V/m to about 12 V/m, such as about 0.02 V/m to about 1 V/m, such as about 0.02 V/m to about 0.15 V/m, for pulses of electromagnetic fields of at least 5 microseconds, such as at least 7 microseconds, such as at least 10 microseconds. In some embodiments, the sensitivity of the electromagnetic radiation detector apparatus is the same as the electric field strength produced at a testing location, e.g., at the entrance of an AIT, inside the AIT or at the exit of the AIT.

In some embodiments, the receiving antenna 101 is an interchangeable antenna. That is, receiving antenna 101 may be replaced with a receiving antenna that is capable of receiving input signals having a frequency within a desired frequency subrange, e.g., in a subrange of about 10 GHz to about 40 GHz in a range from about 10 GHz to about 100 GHz.

In some embodiments, the receiving antenna 101 is a high gain horn antenna, for example, a horn antenna having a signal gain of 15 decibels (dB) or 20 dB, at an input signal frequency of about 30 GHz.

Suitable receiving antennas for use with the present apparatus include, for example, a Pasternack 20 dB standard gain WR34 horn, Product Identification PE9851-20, Pasternack Enterprises, Inc., Irvine, Calif. Other suitable receiving antennas include 3-D metal printed receiving horn antennas. In some embodiments, 3-D metal printed receiving horn antennas may be used to reduce the cost incurred with commercially available receiving antennas.

In some embodiments, the receiving antenna 101 passes the input signal to a diode detector 102, which converts the electromagnetic pulses into voltage signals, e.g., voltage pulses. In some embodiments, the diode detector 102 is a millimeter wave diode detector, such as a Schottky diode detector, e.g., a millimeter wave Schottky diode detector (KRYTAR™ 203 BK, KRYTAR™, Inc., Sunnyvale, Calif.).

Figure 2:
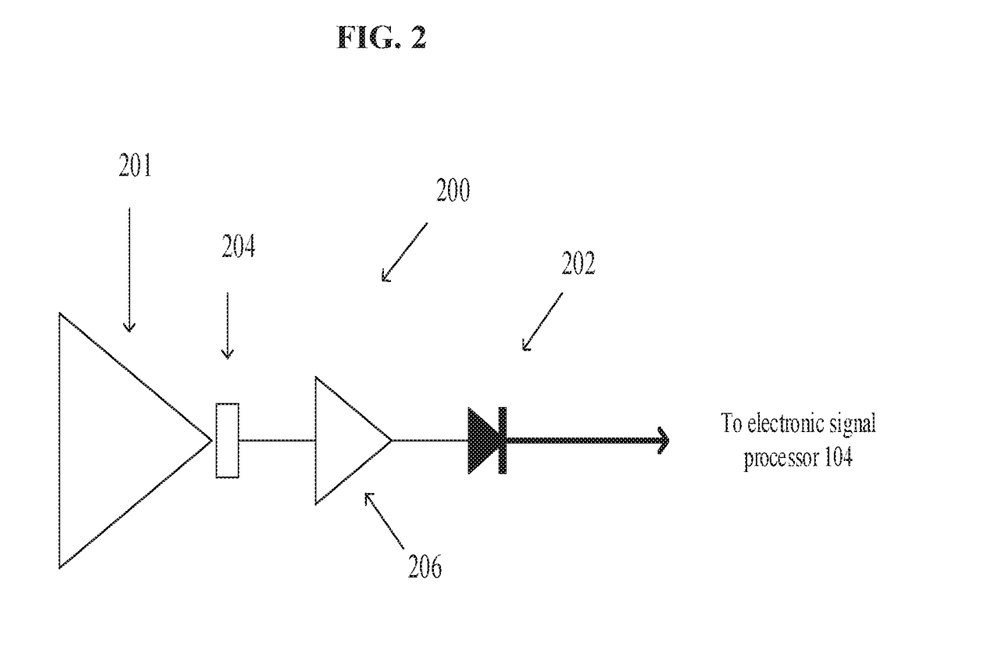
FIG. 2 depicts an implementation of an electromagnetic field receiver as described in the detailed description and the Examples.

FIG. 2 is a diagram depicting an implementation of an electromagnetic field receiver 200. In some embodiments, the receiving antenna 201 is coupled to an adaptor, such as a waveguide to coaxial adaptor 204, which is connected to a low noise amplifier 206 and diode detector 202. In some embodiments, however, the output of the diode detector 202 feeds into an electronic signal processor such as depicted at 104 in FIG. 1 without the need for the low noise amplifier 206. In other embodiments, the low noise amplifier 206 is included in the electromagnetic field receiver 200.

Suitable waveguide to coaxial adapters include those from Pasternack Enterprises, Inc. For example, a Pasternack WR-28 waveguide to coaxial adapter may be used with the present apparatus.

Suitable low noise amplifiers include millimeter wave low noise amplifiers, such as a Miteq AMF-4F-20003000-29-10P millimeter wave low noise amplifier (L3 Narda-MITEQ Inc., Hauppauge, N.Y.). In some embodiments, the low noise amplifier 206 has a gain of at least 10 dB, such as 15 dB, such as 20 dB, such as 25 dB, such as 30 dB, typically 27 dB. In other embodiments, as indicated herein, the low noise amplifier 206 is omitted from the electromagnetic field receiver 200.

In some embodiments, the diode detector 202 converts the pulses of the electromagnetic radiation, such as the pulses of millimeter wave radiofrequency power, from the low noise amplifier 206 to pulsed, low frequency voltage pulses. The output of the diode detector 202 may serve as the input to the electronic signal processor 104 of FIG. 1.

Figure 3:
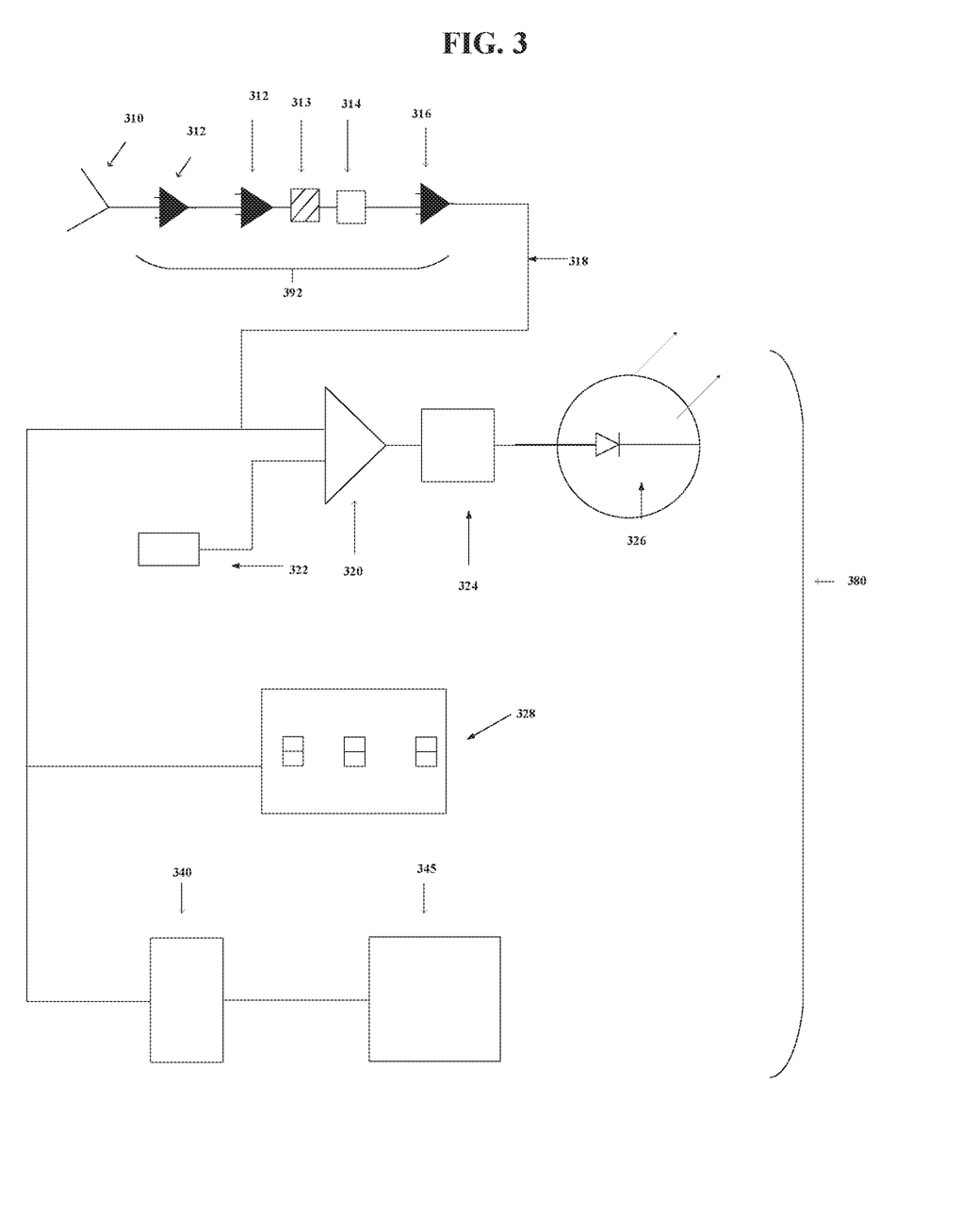
FIG. 3 depicts an implementation of an electronic signal processor and output display as described in the detailed description.

FIG. 3 is a diagram depicting an implementation of an electronic signal processor 392 and an output display 380. In these embodiments, the electronic signal processor 392 includes at least two operational amplifiers 312, which receive an input voltage 310 from an electromagnetic field receiver, e.g., 100 as depicted in FIG. 1, an envelope detection circuit 314, a low frequency operational amplifier 316 and, optionally, an active analog filter circuit 313.

In some embodiments, the output display 380 includes a comparator circuit 320, a reference voltage circuit 322 and a pulse generating circuit 324. The output display 380 may include an indicator 326 and, optionally, a digital display voltmeter 328.

In some embodiments, the output display 380 includes a microprocessor 340 configured to receive an amplified reduced bandwidth unipolar signal 318, which is proportional to the peak power of the input signal and a liquid crystal display 345, such as a graphical digital display.

In some embodiments, the operational amplifiers 312 amplify the voltage signal 310 from an electromagnetic field receiver, such as depicted at 100 in FIG. 1 or 200 in FIG. 2. In some embodiments, the operational amplifiers 312 amplify the input signal in a bandwidth of about 100 kHz. In some embodiments, the amplified voltage signal is then fed into an envelope detection circuit 314. The output of the envelope detection circuit 314 is a reduced bandwidth, unipolar signal, which is proportional to a peak power of the input signal e.g., an electromagnetic field strength, which was input into the receiving antenna 101 of the electromagnetic field receiver 100 of FIG. 1 or the receiving antenna 201 of the electromagnetic field receiver 200 of FIG. 2, for example. The reduced bandwidth, unipolar signal may be subsequently amplified through at least one low frequency operational amplifier 316 with a high gain and reduced bandwidth of less than 100 kHz to produce the amplified reduced bandwidth unipolar signal 318, which is proportional to the peak power of the input signal.

In some embodiments, the electronic signal processor 392 further reduces the overall noise of the voltage signal 310. In some embodiments, this further noise reduction is accomplished via an active analog filter circuit 313, which is connected between the operational amplifiers 312 and the envelope detector 314. In some embodiments, the active analog filter circuit 313 is configured from two operational amplifiers (not shown) having a bandpass ranging from 1 kHz to 100 kHz, such as 20 kHz. The combination of the operational amplifiers 312, the envelope detector 314, the active analog filter circuit 313 and a low frequency operational amplifier 316 can produce an amplified reduced bandwidth unipolar signal 318, which is proportional to the peak power of the input signal, thus eliminating the need for a low noise amplifier 206, e.g., a low noise millimeter wave amplifier, as shown in FIG. 2.

In some embodiments, the envelope detection circuit 314 includes a Schottky diode (not shown), a resistor (not shown) and a capacitor (not shown). The envelope detection circuit 314 typically rectifies the amplified voltage signal (modulated waveform) from the electromagnetic field receiver 100 using a Schottky diode (not shown), which is then integrated with a resistor (not shown) and a capacitor (not shown). This stage reduces overall noise and produces a voltage 318, e.g., a pulsed voltage, which is proportional to the peak power density of the input signal, e.g., an electromagnetic field strength, such as a millimeter wave field strength, detected by the electromagnetic field receiver 100 of FIG. 1, for example.

In some embodiments, the envelope detector is a true root mean square (RMS) chip (not shown), such as an AD636JD chip from Analog Device, Inc. (Norwood, Mass.). The RMS chip (not shown) may act as a low-pass filter as well as an envelope detector. The true RMS chip (not shown) can produce a smooth unipolar envelope from the many short pulses delivered to its input within a large overall pulsed emission burst of e.g., a millimeter wave scanner.

In some embodiments, the amplified reduced bandwidth unipolar signal 318 is fed into one input of a comparator circuit 320, which is included in the output display 380. A second input of the comparator circuit 320 is fed by a reference voltage circuit 322. The reference voltage may be set to correspond to the amplified proportional peak power density of the input signal 318, e.g., the reference voltage may be set to correspond to an electric field strength that slightly exceeds one of any selected electric field strengths of the input signal, e.g., exceeding an electric field strength ranging from about 0.01 V/m to about 12 V/m, such as about 0.02 V/m, for pulses of electromagnetic fields of at least 5 microseconds, such as at least 10 microseconds. In some embodiments, the comparator output voltage is fed to a pulse generating circuit 324, such as a 555 timer, and then to an indicator 326.

In some embodiments, the presence of a comparative voltage signal triggers the pulse-generating circuit 324 to emit one or more pulses, the emitted pulses causing the indicator 326 to indicate a single event for the duration of the pulses, e.g., 1 to 5 seconds, such as 5 seconds. The indicator 326 may be any desired indicator such as a visual indicator, such as an illumination-emitting indicator, e.g., a Light-Emitting Diode (LED) or an audible indicator.

In some embodiments, the output display 380 further includes a digital display voltmeter 328 configured to receive the amplified, reduced bandwidth, unipolar voltage signal 318. The voltmeter 328 displays the magnitude of the amplified, reduced bandwidth, unipolar voltage signal 318.

In another embodiment using a microprocessor 340, the present electromagnetic radiation detector apparatus displays, with a device, such as a liquid crystal display 345, the magnitude of the amplified, reduced bandwidth, unipolar voltage signal 318. In these embodiments, a value corresponding to continuous electromagnetic field strength is displayed, rather than a single event value as described above for the e.g., LED indicator. This field strength display may be useful for, e.g., calibration of the electromagnetic field detector apparatus of the present disclosure or other laboratory purposes.

In some embodiments, the microprocessor 340 is in communication with a wireless interface (not shown). In these embodiments, data in the microprocessor 340 may be transferred to a remote computer for e.g., data archival and/or data processing.

In some embodiments, the electronic signal processor 392 is mounted on a multilayer printed circuit board (not shown). The use of a multilayer circuit board may reduce the noise of the electronic circuitry and external interfering signals.

The increased sensitivity and reduced noise of the detected signals for some designs of the electronic signal processor, such as 392, may allow for the omission of the low noise amplifier shown in FIG. 2 as 206, resulting in a more cost efficient electromagnetic radiation detector apparatus.

In some embodiments, the electronic signal processor 392 is encased in a housing, such as a box (not shown). Typically, the housing (not shown) is an electronically shielded housing, e.g., a metal such as aluminum or steel. In some embodiments, the indicator 326 and/or the liquid crystal display 345 of the output display 380 is mounted on a surface of the housing (not shown). Typically, the electromagnetic field receiver such as shown in FIG. 1 at 100 is mounted on an outside surface of the housing (not shown) to minimize signal losses. For example, losses resulting when a cable or connector is inserted within the path of the electromagnetic signal, such as a millimeter wave signal, e.g., upstream of the diode detector 102 of FIG. 1 or upstream of the low noise amplifier 206 of FIG. 2 coupled to the diode detector 202 of FIG. 2.

Figure 4:
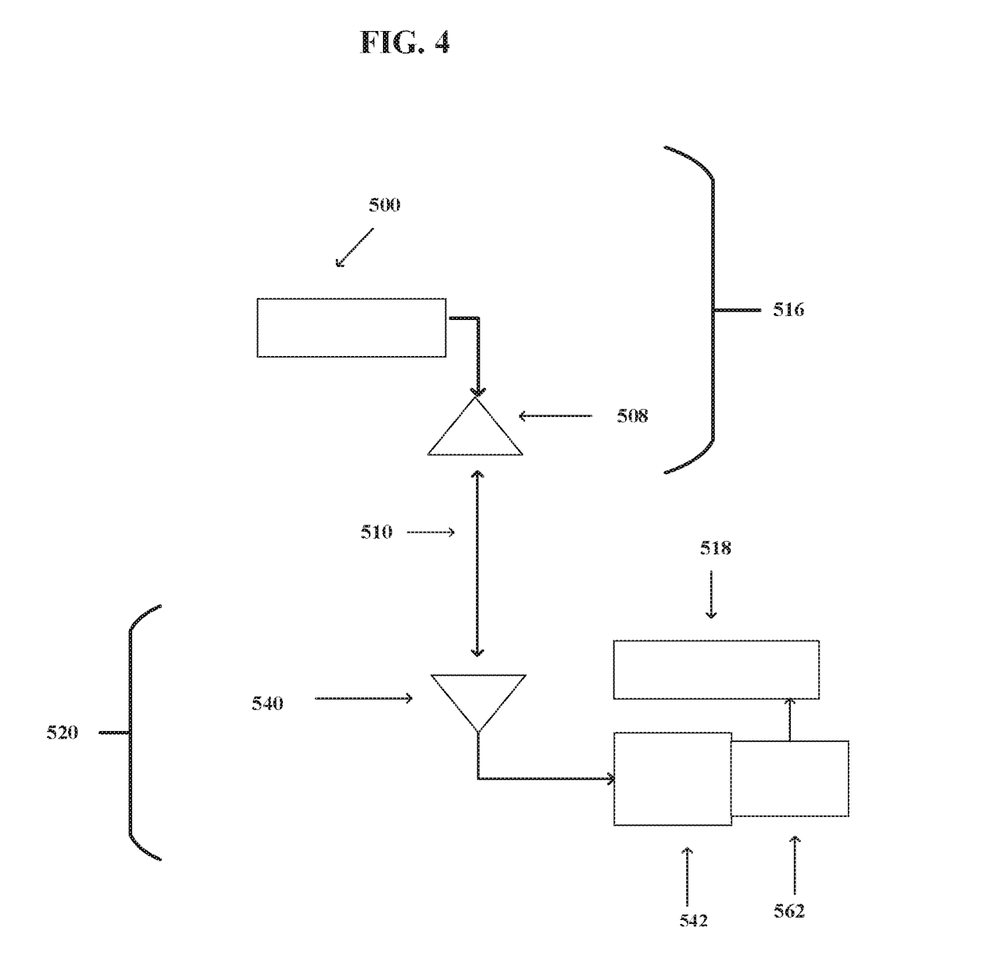
FIG. 4 depicts an implementation of an electromagnetic signal generator and an electromagnetic radiation detector apparatus according to the present disclosure as described in the detailed description and the Examples.

FIG. 4 depicts an implementation of an electromagnetic signal generator 516 and the electromagnetic radiation detector apparatus 520 according to the present disclosure. In this implementation, the electromagnetic signal generator 516 includes an electromagnetic radiation source 500 and a transmitting antenna 508. The electromagnetic radiation detector apparatus 520 includes a receiving antenna 540 at a far field distance 510 from the transmitting antenna 508, a low noise amplifier 542, a diode detector 562, and an output display 518 including an indictor or display 518.

The electromagnetic radiation source 500 may be any desired electromagnetic radiation source as described herein, e.g., a radio frequency (RF) signal generator, a microwave signal generator, a microwave signal generator coupled with an external waveguide source module, etc. The electromagnetic signal generator 516 produces a primary carrier frequency that is then modulated and fed into a transmitting antenna 508, such as a horn antenna. The receiving antenna 540 of the electromagnetic radiation detector apparatus 520 of the instant disclosure is typically located in the far field 510 of a transmitting antenna 508.

As used herein, a field, which is located very near to a transmitting antenna, such as transmitting antenna 508, is termed the "reactive near field." Radiation is not predominant in this field. In contrast, radiation predominates in the region next to the reactive near field, i.e., the "radiating near field" or "Fresnel field." In the Fresnel field, the angular field distribution depends on the physical distance from the transmitting antenna. The far-field, or Fraunhofer region, which is dominated by radiated fields, is located next to the Fresnel field. In this region, the radiation pattern does not change shape with distance from the transmitting antenna.

In some embodiments, the far-field may be defined as:

$$\text{Far-field} \geq 2D^2/\lambda$$

where D is the largest dimension of the radiator (or the diameter of a transmitting antenna) and $\lambda$ is the wavelength of the electromagnetic wave, i.e., $\lambda$ is the speed of light/signal frequency.

Typically, the receiving antenna 540 is located in the far-field 510 of the transmitting antenna 508 in order to receive a calibrated, known field strength that is uniform and predictable. In some embodiments, the location of the receiving antenna 540 relative to the transmitting antenna 508 may be described in terms of numerical ranges. For example, the distance of the receiving antenna 540 from the transmitting antenna 508 may be in the range of 0.1-1.2 meters or in the range of 0.12 to 0.9 meters, such as 0.16 to 0.7 meters, such as 0.7 meters. The skilled person would understand that such range is typically measured from the emitting aperture of the transmitting antenna 508, e.g., from the position at which free-space propagation of the electromagnetic radiation occurs.

Method

The present disclosure is also directed to a method of detecting a low level of short pulses of electromagnetic radiation, such as millimeter wave electromagnetic radiation. In some embodiments, this method includes exposing a receiving antenna, such as an interchangeable antenna, e.g., a high gain horn antenna configured to receive an input signal at frequencies ranging from, for example, 10 GHz to 100 GHz, such as 10 GHz to 40 GHz, as described herein, to an electromagnetic field source, such as signal generator, e.g., such as a millimeter wave scanner, as also herein described. The method further includes providing an output voltage signal in response to an input signal from the electromagnetic field source, via a diode detector coupled to the receiving antenna.

The diode detector, which may convert the electromagnetic signal of the input signal into voltage signals may be a millimeter wave diode detector, such as a Schottky diode detector, e.g., the millimeter wave Schottky diode detector, KRYTAR™ 203 BK from KRYTAR™, Inc., Sunnyvale, Calif.

In some embodiments, the present method further includes amplifying the voltage signal via at least two operational amplifiers cascaded sequentially and then producing a reduced bandwidth, unipolar voltage signal proportional to a peak power of the input signal via an envelope detection circuit. Suitable envelope detection circuits, such as a true RMS chip, are described herein.

In some embodiments, the present method further includes actively filtering the reduced bandwidth, unipolar voltage signal via an active analog filter circuit comprising, e.g., two operational amplifiers as also described herein.

In some embodiments, the present method further comprises amplifying the reduced bandwidth, unipolar voltage signal proportional to the peak power of the input signal via at least one low frequency operational amplifier as also herein described.

In some embodiments, the amplified reduced bandwidth, unipolar voltage signal is compared with a reference voltage signal via a comparator circuit to produce a comparative voltage signal. The comparative voltage signal may be transmitted to a pulse-generating circuit, such as a 555 timer as described herein. One or more pulses emitted from the pulse generating circuit causes an indicator, such as a LED, as described herein, to emit a signal for the duration of the pulse. In some embodiments, the indicator signal indicates the presence of electromagnetic radiation.

In some embodiments, the method further includes configuring a digital display voltmeter to receive the amplified proportional reduced bandwidth, unipolar voltage signal and displaying the magnitude of the amplified proportional reduced bandwidth, unipolar voltage signal.

In some embodiments, the method further comprising analyzing the amplified reduced bandwidth, unipolar voltage signal with a microprocessor configured to process the amplified signal and then displaying a magnitude of the electromagnetic radiation, such as millimeter wave electromagnetic radiation, via a liquid crystal display, such as a graphical digital display as also herein described.

The present disclosure is also directed to a method of detecting a low level of electromagnetic radiation, which includes exposing the electromagnetic radiation detection apparatus as described herein to a source of electromagnetic radiation and then determining a presence or absence of an indicator signal, wherein the presence of the indicator signal indicates the presence of a low level of electromagnetic radiation.

In some embodiments, the source of electromagnetic radiation is an electromagnetic field source, such as a millimeter wave body scanner as described herein.

In some embodiments, the exposing step comprises exposing the present detection apparatus within the signal source, e.g., within a millimeter wave scanner. In other embodiments, the present apparatus is located outside the signal source, e.g., at a distance of about 0.1-2 meters such as 0.7 meters. For example, the receiving antenna of the present apparatus may be located at the entrance of a millimeter wave body scanner or the exit of a millimeter wave body scanner. In the case of an L3 PROVISION® millimeter wave body scanner, the radiating elements sweep around a person being scanned in a few seconds. This exposes the person to many very low-level pulses of millimeter wave energy. The present electromagnetic radiation detector apparatus may be used to sense the emissions under these conditions and to display an indication of a detected level of field strength.

The indicators used to display the detected presence of a low level of electromagnetic radiation include any of the indicators herein described, such as visual indicators. Suitable visual indicators include a LED or a digital graphical display.

The apparatus and method as described herein may be used to ensure the safety of passengers and operational personnel for exposure to electromagnetic radiation from airport security. The apparatus and method as described herein may also be used to ensure that the levels of emitted electromagnetic radiation are sufficiently low such that potential hazards to electronic medical devices, including insulin pumps and medical devices implanted in the body, e.g., cardiac pacemakers, can be avoided.

Reference through the specification to "one embodiment" or "an embodiment" means that a particular feature, structure, or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

EXAMPLES

Example 1. Components of a Portable Electromagnetic Radiation Detector Apparatus with a Commercially Available High Gain Horn Antenna and Low Noise Amplifier Millimeter Wave Receiver A portable millimeter wave detector apparatus was constructed, which included a millimeter wave receiver, an electronic signal processor and an output display. The millimeter wave receiver included a receiving horn antenna with a gain of 20 dB at 30 GHz (Pasternack 20 dB standard gain WR34 horn antenna, Product Identification PE9851-20, Pasternack Enterprises, Inc., Irvine, Calif.). The receiving horn antenna was coupled to a waveguide to coaxial adapter (Pasternack WR-28, Pasternack Enterprises, Inc.). The receiving horn antenna was connected to a low noise amplifier with a gain of 27 dB (Miteq AMF-4F-20003000-29-10P, L3 Narda-MITEQ Inc., Hauppauge, N.Y.). A millimeter wave Schottky diode detector (KRYTAR™ 203 BK, KRYTAR™, Inc., Sunnyvale, Calif.) was connected to the low noise amplifier to convert the pulses of millimeter wave radiofrequency RF (RF) power from the low noise amplifier to pulsed low frequency voltage pulses.

Electronic Signal Processor

The electronic signal processor included an input stage with two operational amplifiers. The operational amplifiers were used to amplify the relatively weak input signal in a bandwidth of approximately 100 kHz. The input stage was coupled to an envelope detection circuit. The envelope detection circuit was used to rectify the modulation waveform with a Schottky diode that was integrated with a resistor and capacitor network. The output of the envelope detection circuit was a reduced bandwidth, unipolar signal, which was then amplified through a low frequency operational amplifier. The signal has high gain and a reduced bandwidth, significantly less than 50 kHz. The electronic signal processor resulted in a signal with reduced overall noise and a pulsed voltage proportional to a temporal peak power density of the millimeter wave field strength, which was initially detected by the electromagnetic radiation detector apparatus. The peak detected voltage was fed to an input of a comparator circuit. A second input of the comparator was fed by a reference voltage circuit. The reference voltage was set to correspond to the voltage proportional to a millimeter wave field strength that slightly exceeds 0.02 V/m for multiple pulses. The positive comparator output voltage triggers a pulse generating circuit composed of a 555 timer circuit. The comparator output was fed to the output display.

Output Display

The output display included two circuits operating in parallel. The circuitry of the output display displayed a single event triggered by multiple pulses detected from the millimeter wave scanner, which illuminated a light that remained "ON" for five seconds. The circuitry, which included a digital panel voltmeter, also displayed a digital field strength that was used for, e.g., calibration or laboratory purposes. This display showed the value of continuous millimeter wave field strength rather than a single event as described above. The displayed voltage on the voltmeter was directly proportional to the peak millimeter wave power density received from a continuous millimeter wave field.

The millimeter wave receiver, electronic signal processor and output display were housed in an aluminum box with dimensions of 12.5×17.5×7.5 centimeters. The millimeter wave receiver components were mounted on the outside of the box to minimize the signal losses. The signal processing circuity was mounted on a single prototype circuit board (11.5×5 cm.). The box has a switch for power ON and OFF and three 9 Volt batteries housed in the box with 2 fuses. The fuses were used to protect the circuitry during the design and test stage. Indicators were mounted on the top of the metal box.

Example 2. Evaluation of the Portable Electromagnetic Radiation Detector Apparatus from Example 1

A system for simulation of the emissions from millimeter wave security AIT scanners was developed previously and was used to perform initial evaluations of the electromagnetic radiation detector apparatus. See U.S. Department of Homeland Security, Science and Technology Directorate, DHS/ST/TSL-12/118, "Compilation of Emission Safety Reports on the L3 Communications, Inc. PROVISION® 100 Active Millimeter Wave Advanced Imaging Technology (AIT) System, version 2", Sep. 1, 2012, 1-130, which is herein incorporated by reference in its entirety. The simulator included an arbitrary waveform generator (Agilent E 33522A, Agilent Technologies, Inc., Santa Clara, Calif.), a millimeter wave signal generator (Agilent MGX-N5183A), an attenuator (BW-S20W5/VAT-10W2+, Mini-Circuits® Inc., Brooklyn, N.Y.), a waveguide coupler (E4419B, ATM 34-310A-10-6-6-6-6, Pasternack Enterprises, Inc.), a power meter (Agilent E4419B, Agilent Technologies, Inc.) and a Horn Antenna (PE9851-20, Pasternack Enterprises, Inc.). This simulator can produce exposure fields that replicate the emissions from an actual millimeter wave AIT. The simulation system allowed the inventors to perform preliminary tests of the present portable millimeter wave detection system without having constant access to an actual millimeter wave-AIT scanner. The simulator system used an Agilent MGX type N5183A Analog Signal Generator to produce a millimeter wave carrier signal (approximately 30 GHz) with pulsed modulation. The signal generator produced square wave modulations of about 100 KHz on the millimeter wave carrier signal, which was then fed to a transmitting antenna so that the generator plus antenna were able to replicate the emissions of the simulation system.

Checks of the millimeter wave detector instrument were performed using the emissions from the simulator system. Radiated field tests with the simulator were performed by delivering simulated AIT pulses to a transmitting antenna. The millimeter wave detector instrument was placed 70 centimeters away from the simulator's antenna along the line of sight of the antenna to produce an exposure of approximately 0.02 V/m at the location of the detector instrument's receiving antenna for short pulses of electromagnetic fields, e.g., 10 microseconds. For single event testing, a burst of a train of pulses from the simulator's millimeter wave signal generator was used. The portable electromagnetic radiation detector apparatus was able to detect the signal and turned the LED indicator "ON" for this exposure.

The performance of the electromagnetic radiation detector apparatus was then verified via testing with an actual AIT scanner, the L3 PROVISION® 2 Compact Advanced Personnel Screening system. The detector instrument worked as designed and sensed a single burst of pulsed fields from the scanner as it swept one time around the spot where a passenger stands when being scanned. Additional testing of the detector apparatus according to the present disclosure was done at other locations around the AIT. The detector sensed emissions at the exit of the AIT scanner where the field strength was weaker.

The sensitivity of the first generation prototype electromagnetic radiation detector apparatus was 0.02 V/m for AIT pulses of electromagnetic fields as short as, e.g., 10 microseconds. This was approximately the field strength produced by the L3-AIT system at the location of a person just exiting the scanner. This level of sensitivity (0.02 V/m) was difficult to achieve due to the low level of the field strength and resulting weak signals being detected. The design of the electromagnetic radiation detector apparatus required measuring a weak signal from a millimeter wave diode detector with a wide bandwidth and a noise level of 0.1 mV or less. The design of the detection circuit is capable of amplifying this signal with two stages of low frequency gain with a bandwidth around 100 KHz. During development of the instrument, noise and oscillation on the circuit signals were observed. These were due to the layout of ground conductors and long wires on a breadboard. These issues were resolved by designing and using a printed circuit board and adding decoupling capacitors to the voltage supply pins of each integrated circuit and using grounding techniques as described in Zumbahlen, H., "Staying Well Grounded", Analog Dialogue, June, 2012, 46: 1-9, which is herein incorporated by reference in its entirety.

Example 3. Components of a Portable Electromagnetic Radiation Detector Apparatus Using a 3-D Metal Printed Receiving Horn without a Low Noise Amplifier

Millimeter Wave Receiver

A second portable electromagnetic detector apparatus was also constructed, which included an electromagnetic field receiver. However, the commercially available antenna used in the initial version was replaced with a 3-D printed metal receiving waveguide horn antenna having a gain of 20 dB. The 3-D printed antenna was designed in the Food and Drug Administration's Additive Manufacturing of Medical Products (AMMP) Lab and was produced by GPI Prototype & Manufacturing Services, Inc. (Lake Bluff, Ill.). The 3-D printed antenna, which was suitable for frequencies ranging from 20-30 GHz, exhibited a performance comparable to the commercially available millimeter wave horn antenna described in Example 1, above. However, the cost of the 3-D printed antenna was much less than that of equivalent, commercially available high gain horn antennas.

The 3-D printed antenna was connected to a millimeter wave diode detector (KRYTAR™ 203 BK, KRYTAR™, Inc.) via a waveguide to coaxial adapter (Pasternack Enterprises, Inc., Irvine, Calif.). The millimeter wave diode detector converted the weak pulses of the millimeter wave power from the antenna to low frequency voltage pulses. The output of the electromagnetic field receiver served as the input to the electronic signal processor, described below.

Electronic Signal Processor

Similar to Example 1, the electronic signal processor of this example included a circuit, which performed amplification, filtering and envelope detection of pulsed voltages from the diode detector. Also similar to Example 1, the electronic signal processor was implemented on a printed circuit board (four-layers) using a solid copper ground plane to produce low noise performance.

The electronic signal processor was also configured with two operational amplifiers (AD827, Analog Devices Inc., Norwood, Mass.), which amplified the weak input signal in a low-pass frequency band of several hundred kHz. This pre-amplification stage, however, was followed by an active analog filter circuit composed of two AD827 operational amplifiers having a bandpass of 20 kHz centered at the frequency of interest. The active analog filter significantly reduced the noise accompanying the received signal.

The output of the active analog filter was fed into an envelope detector, which was a true RMS chip (AD636JD, Analog Devices, Inc.). The RMS chip, which also acted as a low-pass filter, produced a smooth unipolar envelope from the many short pulses delivered to its input within the longer overall pulsed emission burst of the AIT scanner. The frequency range of the output signal was well within the maximum sampling rate of the digital processing circuit used in the output display described further below.

The output signal from the RMS chip was amplified by a low frequency amplifier with low gain. The low frequency amplifier used was an operational amplifier (AD827, Analog Devices Inc.), which raised the processed signal into the input amplitude range of the analog-to-digital converter described below.

Output Display

The output display included a low-cost microcontroller development board model with a 32-bit ARM Cortex-M4 microprocessor and a 180 MHz clock (PJRC.com). The microprocessor was fed with the output signal of the electronic signal processor. The operations of the microprocessor included analog data acquisition and digitization, filtering, peak detection, data logging and data storage and output to a graphic digital display. These data were displayed graphically, in real time, in terms of signal strength received versus time, and were stored on an SD memory card that could be played back on the apparatus itself or displayed on a personal computer.

The output display further included a 3.5 inch color liquid crystal display with touch interactivity. The liquid crystal display received digital input data from the microprocessor and displayed a graphical waveform of the signal being received in a storage oscilloscope-type display. Text data were also displayed, such as the numerical value of the peak field strength. User controls included touch screen features on the liquid crystal display for selecting different functions such as the starting and stopping of data acquisition and the recall and playback of displayed graphical data.

Mechanical Construction and Power Supply

The electronic signal receiver, the millimeter wave diode detector, two rechargeable 9-volt Nickel-metal hydride batteries and a 3.7-volt lithium ion polymer battery were housed in an aluminum box with dimensions of 15×10×5 centimeters. The 3-D printed horn antenna was mounted outside of the box. The electromagnetic radiation detector apparatus was completely portable and self-contained. The apparatus, accordingly, can be used at any scanner location requiring evaluation.

Example 4. Testing and Calibration of the Electromagnetic Radiation Detector Apparatus of Example 3

The electromagnetic radiation detector apparatus of this example was designed, calibrated and tested primarily using the AIT simulation system described above. The apparatus was placed 70 centimeters away from the AIT simulator's radiating antenna along the line of sight. This placement produced an exposure of approximately 0.02 V/m at the location of the receiving antenna. The apparatus detected a burst of about five or more pulses and displayed the burst momentarily on the graphical display as a line plot versus time. The peak value in volts per meter was captured and displayed as a numerical value on the apparatus's LCD screen. The data were stored in the memory of the apparatus for immediate playback of the waveform or for later analysis.

The performance of the handheld, portable apparatus was also tested with an actual AIT-2, i.e., the L3 PROVISION® 2 Compact Advanced Personnel Screening system. The apparatus correctly sensed a burst of pulsed fields from the scanner as the scanner swept around the spot where a passenger stands during scanning. Additional testing of the electromagnetic radiation detector apparatus was performed at other locations around the AIT-2 security system. These data were recorded in system memory and were analyzed later and used to assess the performance of the electromagnetic radiation detector apparatus. Several refinements were incorporated in the software of the apparatus based upon the results of these AIT tests to improve performance.

We claim:

1. An apparatus, for detecting low level pulses of millimeter wave electromagnetic radiation, comprising:
   i) an electromagnetic field receiver comprising:
      a receiving antenna configured to receive an input signal at one or more frequencies ranging from 10 GHz to 100 GHz, and
      a diode detector, coupled to the receiving antenna, configured to convert pulses in the input signal into an output voltage signal, the pulses each having an electric field strength of at least 0.02 V/m and a duration of at least 5 microseconds; and
   ii) an electronic signal processor, inside an electronically shielded housing, configured to produce an amplified, reduced-bandwidth, unipolar voltage signal based on the output voltage signal.

2. The apparatus of claim 1, wherein the electromagnetic field receiver does not include a low noise amplifier.

3. The apparatus of claim 1, wherein the receiving antenna is an interchangeable antenna.

4. The apparatus of claim 1, wherein the diode detector comprises a Schottky diode.

5. The apparatus of claim 1, wherein the electronic signal processor is further configured to produce an amplified voltage signal, using sequentially-cascaded operational amplifiers, based on the output voltage signal.

6. The apparatus of claim 5, wherein the electronic signal processor is further configured to produce a reduced-bandwidth, unipolar voltage signal, that is based on the amplified voltage signal and proportional to a peak power of the input signal, using an envelope detection circuit.

7. The apparatus of claim 6, wherein the electronic signal processor is further configured to produce the amplified, reduced-bandwidth, unipolar voltage signal using a low frequency operational amplifier configured to receive the reduced-bandwidth, unipolar voltage signal.

8. The apparatus of claim 7, further comprising an active analog filter circuit connected between the sequentially-cascaded operational amplifiers and the envelope detection circuit.

9. The apparatus of claim 6, wherein the envelope detection circuit is a true root mean square (RMS) chip.

10. A hand-held portable apparatus for detecting low level pulses of millimeter wave electromagnetic radiation comprising:
   an electromagnetic field receiver comprising:
      a receiving antenna configured to receive an input signal at one or more frequencies ranging from 10 GHz to 100 GHz, and a diode detector, coupled to the receiving antenna, configured to convert pulses in the input signal into an output voltage signal, the pulses each having an electric field strength of at least 0.02 V/m and a duration of at least 5 microseconds;

an electronic signal processor, encased in an electronically shielded housing, configured to produce an amplified, reduced-bandwidth, unipolar voltage signal based on the output voltage signal; and an output display, comprising a microprocessor and a graphical digital display, configured to receive the amplified, reduced-bandwidth, unipolar voltage signal and, wherein the microprocessor analyzes the amplified, reduced-bandwidth, unipolar voltage signal and drives the graphical digital display.

11. The apparatus of claim 10, wherein the electromagnetic field receiver does not include a low noise amplifier.

12. The apparatus of claim 10, wherein the receiving antenna is an interchangeable antenna.

13. The apparatus of claim 10, wherein the electronic signal processor is further configured to produce an amplified voltage signal, using sequentially-cascaded operational amplifiers, based on the output voltage signal.

14. The apparatus of claim 13, wherein the electronic signal processor is further configured to produce a reduced-bandwidth, unipolar voltage signal, that is based on the amplified voltage signal and proportional to a peak power of the input signal, using an envelope detection circuit.

15. The apparatus of claim 14, wherein the electronic signal processor is further configured to produce the amplified, reduced-bandwidth, unipolar voltage signal using a low frequency operational amplifier configured to receive the reduced-bandwidth, unipolar voltage signal.

16. The apparatus of claim 15, further comprising an active analog filter circuit connected between the sequentially-cascaded operational amplifiers and the envelope detection circuit.

17. A method of detecting a low level of short pulses of millimeter wave electromagnetic radiation comprising:

exposing a receiving antenna to pulses of electromagnetic fields from a signal generator, wherein the receiving antenna is configured to receive an input signal at one or more frequencies ranging from 10 GHz to 100 GHz;

providing an output voltage signal via a diode detector coupled to the receiving antenna, wherein the output voltage signal is in response to the input signal;

amplifying the voltage signal, to produce an amplified output voltage signal;

producing a reduced bandwidth, unipolar voltage signal based on the amplified output voltage signal and proportional to a peak power of the input signal;

amplifying the reduced bandwidth, unipolar voltage signal, to produce an amplified reduced bandwidth, unipolar voltage signal;

analyzing the amplified reduced bandwidth, unipolar voltage signal with a microprocessor; and displaying a magnitude of the millimeter wave electromagnetic radiation via a graphical digital display.

18. The method of claim 17, wherein the signal generator is a millimeter wave scanner.

19. The method of claim 17, wherein the receiving antenna is an interchangeable antenna.

20. The method of claim 17, further comprising actively filtering the reduced bandwidth, unipolar voltage signal via an active analog filter circuit.

* * * * *